United States Patent [19]
Bork et al.

[11] 4,430,594
[45] Feb. 7, 1984

[54] DEVICE FOR CONTACTING TUBULAR PIEZO-ELECTRIC TRANSDUCERS

[75] Inventors: Klaus Bork; Rolf Humbs; Karl Trey, all of Munich, Fed. Rep. of Germany

[73] Assignee: Siemens Aktiengesellschaft, Berlin & Munich, Fed. Rep. of Germany

[21] Appl. No.: 465,120

[22] Filed: Feb. 9, 1983

[30] Foreign Application Priority Data

Mar. 10, 1982 [DE] Fed. Rep. of Germany ....... 3208679

[51] Int. Cl.³ ..................... H01L 41/08; G01D 15/18
[52] U.S. Cl. ................................. 310/328; 310/351; 310/369; 346/140 R
[58] Field of Search ............... 310/328, 348, 351–353, 310/369, 344; 346/75, 140 R

[56] References Cited

U.S. PATENT DOCUMENTS

| | | | |
|---|---|---|---|
| 3,211,931 | 10/1965 | Tehon | 310/369 X |
| 3,287,579 | 11/1966 | Borner et al. | 310/369 X |
| 3,557,616 | 1/1971 | Landon, Jr. et al. | 310/328 X |
| 3,612,922 | 10/1971 | Furnival | 310/351 |
| 3,700,939 | 10/1972 | Abbott | 310/369 X |
| 4,308,546 | 12/1981 | Halasz | 310/369 X |

FOREIGN PATENT DOCUMENTS 2740773 3/1979 Fed. Rep. of Germany.
1239596 10/1959 France ................................. 310/369

Primary Examiner—Mark O. Budd
Attorney, Agent, or Firm—Hill, Van Santen, Steadman & Simpson

[57] ABSTRACT

A contacting device for electrically connecting rows of tubular piezo transducers of a printing head of an ink printing device consisting of a printed circuit board having separate conductor paths, a row of feedthrough holes for each row of transducer elements with one hole for each element, a first contact element having an inside contact sleeve biased against the inside wall of the transducer element and a flexible spacer extending therefrom and through an opening in the board adjacent the feedthrough hole, a second contacting element having a resilient connector supporting a resilient clamp for embracing the outer surface of the element being mounted in another hole adjacent the feedthrough opening with both the elastic spacer and the resilient connector being soldered to the conductor paths so that the element is positioned above the feedthrough hole and an electrical current can be applied to the transducer.

5 Claims, 1 Drawing Figure

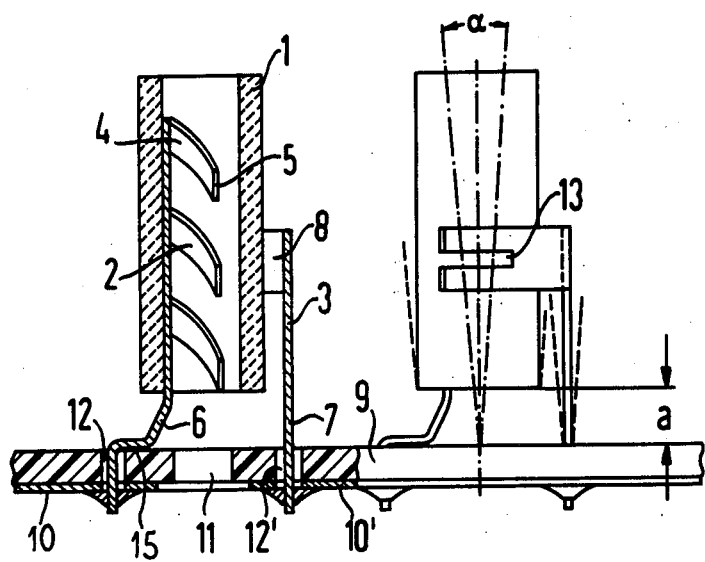

DEVICE FOR CONTACTING TUBULAR PIEZO-ELECTRIC TRANSDUCERS

BACKGROUND OF THE INVENTION

The present invention is directed to a device for contacting each of a plurality of tubular piezo-electric transducer elements which are arranged in rows and encapsulated in a synthetic material to form a printing head for an ink printing device.

A device for contacting tubular piezo-electric transducer elements in a printing head of an ink printing device is disclosed in German OS 27 40 773. In this device, the transducer elements are disposed in rows and diverge radiantly from an ink discharge opening with the diverging elements being encapsulated in a synthetic material such as plastic. The device for contacting and positioning consist of a sheet-like flexible conductive film on which the transducer elements that are to be contacted are disposed and contacted by wire helixes which are received on the inside of each of the transducer elements. The outer surface of each of the elements is contacted by a solder connection. Subsequent to securing each of the elements on the foil, the entire arrangement of foils is then encapsulated in a synthetic material or plastic with wire segments or mandrels being temporarily placed to extend through each of the transducer elements to maintain the desired position for the elements and after the synthetic material has been cured, these wire segments or mandrels are removed to form the ink channels.

The above described manufacturing method is relatively expensive. Since automation of the manufacturing process can only be conditionally possible, it is very expensive when adapted to a mass production process.

SUMMARY OF THE INVENTION

The present invention is directed to providing a device for contacting each of a plurality of tubular piezo-electric transducer elements which are arranged in rows and encapsulated in synthetic material to form a printing head for an ink printing device which contacting device enables an extensive automation of the assembly procedures and operations and simplifies the manufacturing of the printing head.

To accomplish these goals, the device for contacting each of the plurality of tubular piezo-electrical transducer elements which are arranged in rows and encapsulated in synthetic material to form the printing head comprises a printed circuit board; a first contacting element and a second contacting element for each transducer element, each of the first contacting elements consisting of an inside contact sleeve having a contact surface resiliently pressing against an inside wall surface of the transducer element, said inside contact sleeve being connected to a flexible spacer extending out of the transducer element, each of the second contact elements comprising a resilient connector with a resilient clamp for elastically embracing the outside of the transducer element extending therefrom, said circuit board having a row of feedthrough holes for each row of elements with one feedthrough hole for each of the transducer elements, each feedthrough hole having a first acceptance open extending into an electrical conductor path and a second acceptance opening extending into a different conductor path; means for securing the flexible spacer of each first conductor element in the first opening and in electrical contact with the conductor path associated therewith and means for securing each of the resilient connectors of the second conductor elements in the respective second openings and in electrical contact with the conductor path associated therewith so that each of the transducer elements were situated a fixed distance from each of the feed holes and aligned therewith.

The present invention makes it possible to automatically equip each of the transducer elements which consist of a piezo-electrical hollow tube with stamped contacting elements and to then assemble the piezo-electric tubes to extend at right angles into the printed circuit board which is provided with the acceptance openings for each of the contacting elements. After insertion of the contacting elements into the acceptance openings of the printed circuit board, they can be connected by either a soldering process such as flow solder or drag solder to the various conductor paths.

All contacting elements are elastically designed in their base areas so that an oblique attitude of the transducer element required for the printhead assembly in the casting process is possible. The temporary wire segments or mandrels, which are required in the casting process for producing the ink channels, can be threaded through the printed circuit board into each of the transducer elements to thereby assure alignment between the openings provided in the circuit board and the transducer elements. After the encapsulating process, these wire segments are again removed as in the previously known process.

BRIEF DESCRIPTION OF THE DRAWING

The FIGURE is a side view of an embodiment of the device of the present invention with portions in cross-section for purposes of illustration.

DESCRIPTION OF THE PREFERRED EMBODIMENTS

The principles of the present invention are particularly useful for positioning a plurality of piezo-electric transducer elements 1 in rows on a printed circuit board 9 prior to encapsulation to form a printing head.

As illustrated, each of the tubular piezo-electric elements 1 of a printing head of an ink printing device are arranged in a row and will be subsequently encapsulated in a synthetic material such as a synthetic plastic. To position each of the elements 1, two contacting elements, namely, a first contacting element 2 and a second contacting element 3 are utilized. Both the contacting elements 2 and 3 are single one-piece members and are manufactured from sheet metal by a stamping method. The first contacting element 2 will have an inside contacting sleeve 4 having a contact surface 5 which is pressed radially elastically against the inside wall surface of the transducer element 1. The contact sleeve 4 is connected to a flexible spacer 6 which will extend out of the tubular element 1 and as illustrated has a right angle bend forming a shoulder 15. The second contacting element 3 has a resilient connector 7 and a resilient clamp portion 8 which elastically embraces the outside surface of the transducer element. Thus, the clamp element 8 is biased to grip the outside surface of the element 1 while the contacting sleeve 4 is biased to grip the inside wall surface.

In an automated process, an automated device which is not illustrated will assemble the contacting elements 2 and 3 on the transducer elements 1. Thus, the first contact element 2 is designed to be inserted into the transducer element and make contact with the inside surface due to the resilient nature of the sleeve portion 4 while the clamp 8 of the second contact element will grip the outside of the sleeve 1.

The printed circuit board 9 will have a plurality of conductor paths 10 and 10' which can receive the driving currents for the transducer elements. As illustrated, the printed circuit board 9 has a row of feedthrough holes 11 which form part of the ink channels for the transducer elements. Each of the feedthrough holes 11 has a first acceptance opening 12 and a second acceptance opening 12'. The acceptance openings 12 and 12' are arranged adjacent to their feedthrough hole 11 and extend through conductor paths 10 and 10', respectively.

The contact elements 2 and 3 with their respective transducer element 1 are assembled on the board by the flexible spacer 6 being inserted into the opening 12 and the resilient conductor 7 being inserted into the opening 12'. In such an arrangement, the central opening of each of the elements 11 will be positioned in alignment directly above the feedthrough hole 11 at a distance a. This distance is maintained or selected by the position of the shoulder 15. After insertion of the contact elements into the respective acceptance holes 12 and 12' of the printed circuit board, a soldering process such as a flow or drag soldering is carried out to electrically connect the path 10 to the flexible spacer 6 and the path 10' to the resilient connector 7.

The elastic design of the flexible spacer 6 of the first contact element 2 having the shoulder 15 serves as a spacer in conjunction with the resilient connector 7 of the second contacting element. Due to the elastic nature of both the connector 7 and the spacer 6, the transducer element 1 can be pivoted around an angle α during the subsequent assembly of the print head. To this end, wire segments or mandrels are placed through the feed hole 11 and through the center openings in each of the elements 1 to obtain the desired alignment of the transducer element with the opening 11 and the desired aim of the ink channels when the arrangement of elements 1 on the board 9 are encapsulated.

Other embodiments are conceivable for designing the contact elements. Thus, it is possible to design the inner contact sleeve 4 of the contact element 2 so that it consists of a half spiral fan comb-like which can be stamped in a particularly simple manner. Additional slits such as 13 can be provided on the clamps 8 to increase the elasticity so that the clamp will be biased onto the outer surface of the elements 1. The individual fingers being formed therefrom will improve the contactability of each of the connectors 2 and 3.

It should be pointed out that the design of the contacting elements should be to improve the elastic properties. However, the portions of each of the elements which create the contact with the transducer element are designed in such a term that with regard to their contact force that no plastic flow or creep should occur in the contacting area during the elevated temperatures involved with the encapsulation.

Although various minor modifications may be suggested by those versed in the art, it should be understood that we wish to embody within the scope of the patent granted hereon, all such modifications as reasonably and properly come within the scope of our contribution to the art.

We claim:

1. A device for contacting each of a plurality of tubular piezo-electrical transducer elements which are arranged in rows and encapsulated in a synthetic material to form a printing head for an ink printing device, said device comprising a printed circuit board; a first contacting element and a second contacting element for each transducer element, each of the first contacting elements consisting of an inside contact sleeve having a contact surface resiliently pressing against an inside wall surface of a transducer element, said inside contact sleeve being connected to a flexible spacer extending out of the transducer element, each of the second contact elements comprising a resilient connector with a resilient clamp for elastically embracing the outside of the transducer element extending therefrom, said circuit board having a row of feedthrough holes for each row of elements with one feedthrough hole for each of the transducer elements, each feedthrough hole having a first acceptance opening extending into an electrical conductor path and a second acceptance opening extending into a different conductor path; means for securing the flexible spacer of each first conducting element in the first openings and in electrical contact with the conductor path associated therewith; and means for securing each of the resilient connectors of the second conducting elements in the respective second openings and in electrical contact with the conductor path associated therewith so that each of the transducer elements are situated at a fixed distance from each of the feedthrough holes and aligned therewith.

2. A device according to claim 1, wherein the inside contact sleeve of each of the first contacting elements consist of a half-spiral fanned comb-like piece of sheet metal.

3. A device according to claim 1, wherein each of the first and second contact elements consist of a single stamped metal piece.

4. A device according to claim 3, wherein the inside contact sleeve of each of the first contact elements has a half-spiral fanned comb-like shape.

5. A device according to claim 1, wherein each of the flexible spacers has at least one right angle bend to form a shoulder to establish the desired spacing of the transducer element from the circuit board.

* * * * *